US012610623B2

(12) United States Patent
Khaund et al.

(10) Patent No.: US 12,610,623 B2
(45) Date of Patent: Apr. 21, 2026

(54) ELECTROSTATIC DISCHARGE, ESD, PROTECTION SEMICONDUCTOR DEVICE FOR PROVIDING ESD PROTECTION BETWEEN A FIRST AND A SECOND TERMINAL OF ANOTHER SEMICONDUCTOR DEVICE, AS WELL AS A CORRESPONDING METAL OXIDE SEMICONDUCTOR, MOS, FIELD EFFECT TRANSISTOR, FET, AND A RELATED METHOD

(71) Applicant: NEXPERIA B.V., Nijmegen (NL)

(72) Inventors: Chinmoy Khaund, Hamburg (DE); Manoj Kumar, Hamburg (DE); Kilian Ong, Hamburg (DE)

(73) Assignee: Nexperia B.V., Nijmegen (NL)

( * ) Notice: Subject to any disclaimer, the term of this patent is extended or adjusted under 35 U.S.C. 154(b) by 392 days.

(21) Appl. No.: 18/483,047

(22) Filed: Oct. 9, 2023

(65) Prior Publication Data

US 2024/0120331 A1 Apr. 11, 2024

(30) Foreign Application Priority Data

Oct. 7, 2022 (EP) .................................... 22200290

(51) Int. Cl.
*H10D 89/60* (2025.01)

(52) U.S. Cl.
CPC ......... *H10D 89/611* (2025.01); *H10D 89/811* (2025.01)

(58) Field of Classification Search
CPC ............................ H10D 89/611; H10D 89/811
USPC ......................................................... 257/355
See application file for complete search history.

(56) References Cited

U.S. PATENT DOCUMENTS

| | | | | |
|---|---|---|---|---|
| 2011/0210418 A1* | 9/2011 | Esmark | ................ | H10D 89/711 |
| | | | | 257/E21.572 |
| 2021/0305802 A1* | 9/2021 | Yeh | ........................ | H01L 25/043 |
| 2021/0305809 A1* | 9/2021 | Hung | ................... | H10D 89/817 |
| 2021/0407987 A1* | 12/2021 | Shen | .................... | H10D 89/611 |

* cited by examiner

*Primary Examiner* — Igwe U Anya
(74) *Attorney, Agent, or Firm* — Ruggiero McAllister & McMahon LLC

(57) ABSTRACT

The disclosure relates to an Electrostatic Discharge (ESD) protection semiconductor device for providing ESD protection between a first and a second terminal of another semiconductor device, the ESD protection device includes a semiconductor body having a first major surface, the semiconductor device further includes a first ESD terminal arranged to be connected to a first terminal of the other semiconductor device, a second ESD terminal arranged to be connected to a second terminal of the other semiconductor device, and a floating terminal.

17 Claims, 4 Drawing Sheets

ELECTROSTATIC DISCHARGE, ESD, PROTECTION SEMICONDUCTOR DEVICE FOR PROVIDING ESD PROTECTION BETWEEN A FIRST AND A SECOND TERMINAL OF ANOTHER SEMICONDUCTOR DEVICE, AS WELL AS A CORRESPONDING METAL OXIDE SEMICONDUCTOR, MOS, FIELD EFFECT TRANSISTOR, FET, AND A RELATED METHOD

CROSS-REFERENCE TO RELATED APPLICATIONS

This application claims the benefit under 35 U.S.C. § 119(a) of European Application No. 22200290.9 filed Oct. 7, 2022, the contents of which are incorporated by reference herein in their entirety.

BACKGROUND

1. Field of the Disclosure

The present disclosure relates to the field of Electrostatic Discharge, ESD, protection and, more in particular, to an ESD protection semiconductor device implemented in a semiconductor material.

2. Description of the Related Art

A Trench Gate Metal Oxide Semiconductor, MOS, Field Effect Transistor, FET, typically comprises a source region towards a first major surface of the MOSFET and a drain region formed on a second major surface, opposite to the first major surface. The source and drain region have the same conductivity type.

A channel-accommodating region, i.e. a body region, is provided between the source and drain region, which channel-accommodating region is of a different conductivity type to that of the source and drain region. A conductive channel is to be construed between the source region and the drain region to assure that the MOSFET is turned on. To facilitate the creation of such a channel, a trench gate electrode is provided close to, but not in electrical contact with, the channel-accommodating region.

Typical for the trench gate MOSFET is that the current is conducted vertically from one surface to the other so as to achieve a high drive capability. It may be realized by packing trenches on a chip, deep enough to cross the oppositely doped body region, i.e. channel-accommodating region, below the top surface.

The gate trench is typically provided with some sort of oxide, to assure that the gate electrode is electrically isolated from the channel-accommodating region. Providing a voltage bias at the gate trench will then produce an electrical field which extends into, and thus also locally depletes and/or inverts, the channel-accommodating region.

Trench gate MOSFETs are able to cope with high voltage operations, for example in the region of 100V or above. In addition, such MOSFETs may be able to cope with high reverse bias voltages between the source region and the drain region, without that the MOSFET will break down of pass any significant reverse current.

The above is typically achieved by introducing a drift region between the drain region and the channel-accommodating region, wherein the drift region has the same conductivity type as the source region and the drain region. The drift region, however, typically has a lower doping concentration. The drain region forms a PN junction at the interface with the channel-accommodating region which serves to block the reverse bias current.

For N-channel MOSFETs, the drain region is positive relative to the source region. If the source region is positive relative to the drain region, then the body-drain junction may become biased and current may be conducted via the drain region and the source region. Alternatively, for P-channel MOSFETs, the drain region is negative relative to the source region. If the source region is negative relative to the drain region, then the body-drain junction may again conduct current. The breakdown voltage is dependent on the thickness of the drift region wherein the greater the thickness, the higher the breakdown voltage.

When comparing the more conventional lateral MOSFETs with vertical trench-gate MOSFETs, like the one described above, it is clear that in vertical trench-gate MOSFETs, the channel regions are designed along the vertical walls of the trenches, rather than laterally. This allows for a high density of channels, i.e. two for each trench, per unit area of the device.

One of the downsides of MOSFETs is that they may be prone Electrostatic Discharge, ESD. The same is applicable for other type of semiconductor devices.

SUMMARY

A summary of aspects of certain examples disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

It is an object of the present disclosure to provide for an Electrostatic Discharge, ESD, protection semiconductor device for providing ESD protection between a first and a second terminal of another semiconductor device.

It is a further object of the present disclosure to provide for a Metal Oxide Semiconductor, MOS, Field Effect Transistor, FET, MOSFET, wherein the MOSFET further comprises an ESD protection semiconductor device in accordance with the present disclosure.

In a first aspect, there is provided An Electrostatic Discharge, ESD, protection semiconductor device for providing ESD protection between a first and a second terminal of another semiconductor device, the ESD protection device comprising a semiconductor body having a first major surface, wherein the semiconductor device further comprises a first ESD terminal arranged to be connected to a first terminal of the other semiconductor device, a second ESD terminal arranged to be connected to a second terminal of the other semiconductor device, and a floating terminal, and wherein the semiconductor body further comprises:

a first ESD region of a first conductivity type and extending from the first major surface into said semiconductor body, wherein the first ESD region comprises: a first diode region of a second conductivity type, wherein the first diode region is connected to the first ESD terminal;
a second diode region of the second conductivity type, spaced apart from said first diode region, wherein the second diode region is connected to the floating terminal;
a second ESD region of a first conductivity type and extending from the first major surface into said semiconductor body, wherein the second ESD region comprises: a third diode region of the second conductivity type, wherein the third diode region is connected to the floating terminal; a fourth diode region of the second conductivity type, spaced apart from said third diode region, wherein the fourth diode region is connected to the second ESD terminal, wherein, seen in a view of said ESD protection semiconductor device perpendicular to said first major surface, said first and second ESD regions are both elongated, and wherein said floating terminal comprises multiple individual floating strips provided electrically isolated from each other and each for providing an individual connections between said second diode region and said third diode region.

The present disclosure has several advantages over more traditional ESD protection.

First of all, the inventors have found that it may be beneficial to incorporate ESD protection in the semiconductor body. That is, the diodes are actually implemented in the semiconductor body, for example in silicon material. This may ensure that the leakage current is relatively low, for example a couple of nano Ampere.

Second, another advantage is that in a top view of said ESD protection semiconductor device, said ESD protection semiconductor device is elongated, and wherein said floating terminal comprises individual, electrically isolated, floating strips for providing connections between said second diode region and said third diode region.

The main advantage of this aspect is that the active area of the semiconductor material is improved. The span of the diodes may be reduced, for example to about 14.5 µm, as will be apparent later when referring to the figures.

The introduction of the new design for the floating terminal fulfils different design rules that need to be considered when designing ESD protection. The present disclosure discloses creating individual, electrically, isolated floating strips. This means that those strips will not "cover" the entire span of the elongated ESD protection semiconductor device.

The space in between subsequent floating strips may be utilized for connection to the first and/or second terminal of the another semiconductor device. This is beneficial for reducing the size of the ESD protection semiconductor device, and thus for improving the active area.

The above described ESD semiconductor device effectively establishes the introduction of four back to back diodes between the first terminal and the second terminal of the another semiconductor device, as there are four interfaces or boundaries between two semiconductor material types. The diodes are oriented in that the cathodes of the diodes are connected to each other. This is accomplished by the layout of the ESD region and the specific diode regions inside that corresponding ESD region.

Typically, the first conductivity type is N-type, and wherein the second conductivity type is P-type, or vice-versa.

It is noted that the ESD protection device may be especially useful for protecting a 12 Volt gate to source voltage of a MOSFET. In case higher voltages are to be protected, even more diodes may be utilized in the design. So, six, eight, or even ten diodes may be used instead of the four diodes. The present disclosure is thus not limited to four diodes, but to at least four diodes.

In an example, the ESD protection device comprises a first, a second and a third isolating trench, wherein each of said three trenches extend into the semiconductor body from the major surface, and wherein said first ESD region is oriented between said first and second isolating trench and wherein said second ESD region is oriented between said second and third isolating trench.

The inventors have found that it might be beneficial to introduce isolating trenches to ensure that the functioning of the ESD protection semiconductor device does not influence the functioning of the another semiconductor device.

Another option is to introduce isolating regions, for example by sacrificing area of the semiconductor material or by a different form of isolation material or design or the like.

The isolating trenches may, for example, be provided with oxide material or any other type of isolating material.

In a further example, in said top view of said ESD protection semiconductor device, a shape of said ESD semiconductor device is a geometric shape thereby enclosing a semiconductor material of said semiconductor body.

For example, the enclosed semiconductor material is to be connected to said first terminal of said another semiconductor device.

The above described example provides for a relatively robust ESD protection for the another semiconductor device. The another semiconductor device may be manufactured in such a way that its first terminal is aligned with the enclosed semiconductor material of the ESD semiconductor device. This allows for an effective ESD protection.

In a further example, the first, second, third and fourth diode regions are each endless loops, seen in said top view, surrounding a central region of semiconductor material forming the first ESD terminal.

The above may entail that there is no end face of the ESD protection semiconductor device, but that the ESD protection semiconductor device is construed in such a way that there is effectively no beginning or end, just like a circle.

In an example, in said top view of said ESD protection semiconductor device:

said first diode region is connected to the first ESD terminal at locations in between said individual, electrically isolated, floating strips, and/or said fourth diode region is connected to the second ESD terminal at said locations in between said individual, electrically isolated, floating strips.

The above described example provides for an effective way of protecting a MOSFET, wherein the first terminal is the gate terminal of the MOSFET and the second terminal if the source terminal of the MOSFET.

In a second aspect of the present disclosure, there is provided a Metal Oxide Semiconductor, MOS, Field Effect Transistor, FET, MOSFET, having a gate pad and a source pad embodied in a semiconductor material, wherein said MOSFET further comprises an Electrostatic Discharge, ESD, protection semiconductor device in accordance with any of the previous examples.

It is noted that the advantages as explained with reference to the first aspect of the present disclosure, being the ESD protection semiconductor device, are also applicable to the second aspect of the present disclosure, being the MOSFET.

In a specific example, the ESD protection device is aligned with said gate pad of said MOSFET.

In a third aspect of the present disclosure, there is provided a method of manufacturing an Electrostatic Discharge, ESD, protection device in accordance with any of the examples provided above, wherein said method comprises the steps of: forming a first ESD region of a first conductivity type and extending from the first major surface into said semiconductor body; forming a first diode region of the second conductivity type, in the first ESD region, wherein the first diode region is connected to the first ESD terminal; forming a second diode region of the second conductivity type, in the first ESD region, spaced apart from said first diode region, wherein the second diode region is connected to a floating terminal; forming a second ESD region of a first conductivity type and extending from the first major surface into said semiconductor body: a third diode region of the second conductivity type, in the second ESD region, wherein the third diode region is connected to the floating terminal; a fourth diode region of the second conductivity type, in the second ESD region, spaced apart from said third diode region, wherein the fourth diode region is connected to the second ESD terminal, wherein, in a top view of said ESD protection semiconductor device, said ESD protection semiconductor device is elongated, and wherein said method comprises the step of: forming said floating terminal comprising forming individual, electrically isolated, floating strips for providing connections between said second diode region and said third diode region.

In an example, the method further comprises the step of: forming a first, a second and a third isolating trench, wherein each of said three trenches extend into the semiconductor body from the major surface, and wherein said first ESD region is oriented between said first and second isolating trench and wherein said second ESD region is oriented between said second and third isolating trench.

In a further example, the ESD protection semiconductor device is formed such that in said top view of said ESD protection semiconductor device, a shape of said ESD protection semiconductor device is a geometric shape thereby enclosing a semiconductor material of said semiconductor body.

In another example, the ESD protection semiconductor device is formed such that the first, second, third and fourth diode regions are each endless loops, seen in said top view, surrounding a central region of semiconductor material forming the first ESD terminal.

In yet another example, the ESD protection semiconductor device is formed such that, in said top view of said ESD protection semiconductor device: said first diode region is connected to the first ESD terminal at locations in between said individual, electrically isolated, floating strips, and/or said fourth diode region is connected to the second ESD terminal at said locations in between said individual, electrically isolated, floating strips.

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

The above and other aspects of the disclosure will be apparent from and elucidated with reference to the examples described hereinafter.

DETAILED DESCRIPTION

Figure 1:
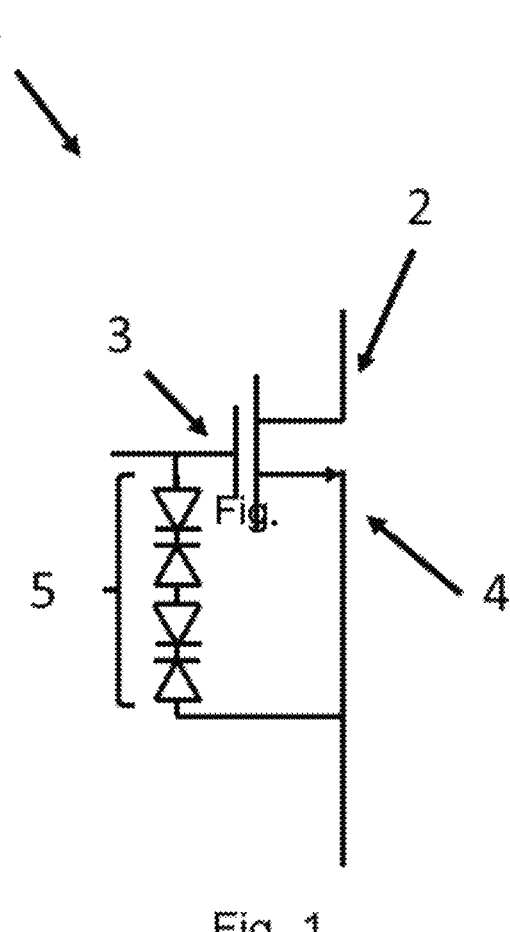
FIG. 1 discloses Electro Static Discharge, ESD, protection for a Metal oxide Semiconductor, MOS, Field Effect Transistor, FET.

It is noted that in the description of the figures, same reference numerals refer to the same or similar components performing a same or essentially similar function.

A more detailed description is made with reference to particular examples, some of which are illustrated in the appended drawings, such that the manner in which the features of the present disclosure may be understood in more detail. It is noted that the drawings only illustrate typical examples and are therefore not to be considered to limit the scope of the subject matter of the claims. The drawings are incorporated for facilitating an understanding of the disclosure and are thus not necessarily drawn to scale. Advantages of the subject matter as claimed will become apparent to those skilled in the art upon reading the description in conjunction with the accompanying drawings.

The ensuing description above provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or," in reference to a list of two or more items, covers all of the following interpretations of the word: any of the items in the list, all of the items in the list, and any combination of the items in the list.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

FIG. 1 discloses Electro Static Discharge, ESD, protection for a Metal oxide Semiconductor, MOS, Field Effect Transistor, FET 1 having a source 4, a drain 2 and a gate 3 terminal.

In MOSFETs, there are typically three basic ESD induced failures namely junction damage, gate oxide damage and metallization burnout. These failures are usually thermally induced, indicating that damage occurs once the temperature of the local area exceeds a critical value, often the melting point of the material.

Junction damage may be caused by the injection of an ESD transient of sufficient energy and duration to force the junction into secondary breakdown. Junction damage is often characterized by high reverse bias leakage current or a total short.

The so-called gate oxide damage may occur when the gate 3 is subjected to an ESD pulse of high enough magnitude to cause the gate oxide to breakdown. For MOSFETs, the gate oxide is typically very thin resulting in varying degrees of ESD sensitivity.

Metallization burnout may exist in metal interconnects or contacts. It may occur if any current flowing through the metal forces a temperature rise that is high enough to reach the melting point of the material. Metallization burnout is often a secondary effect, occurring after the initial junction or gate oxide failure.

To protect a MOSFET from ESD, the main objective is typically to clamp the gate 3 to source 4 voltage from reaching the destructive voltage. A typical ESD protection device 5 clamps the voltage to a lower value at the occurrence of the ESD strike to minimize the voltage seen at the gate of MOSFET. The protection device may shunt current to ground and away from the protected gate 3.

During this period, the clamping voltage and residual current seen at the gate 3 may depend upon the breakdown voltage and the dynamic resistance of the protection device. Once the ESD strike is fully dissipated, the ESD protection device 5 attempts to return to a high impedance state. There are several types of ESD protection devices 5 available today, but most commonly used are Transient-voltage-suppression, TVS, and Zener diodes. In FIG. 1, four cascaded diodes 5 are shown that operate as ESD protection for the MOSFET.

One of the downsides of using such a topology as shown in FIG. 1 is that the leakage current from gate 3 to source 4 is relatively high.

The present disclosure is directed to an independent ESD protection semiconductor device. Independent in the sense that it may be used for protecting an MOSFET, but it may also be used for protecting any other type of semiconductor device. Further, the ESD protection semiconductor device is implemented in the semiconductor body, i.e. in the silicon material of the semiconductor body.

Figure 2:
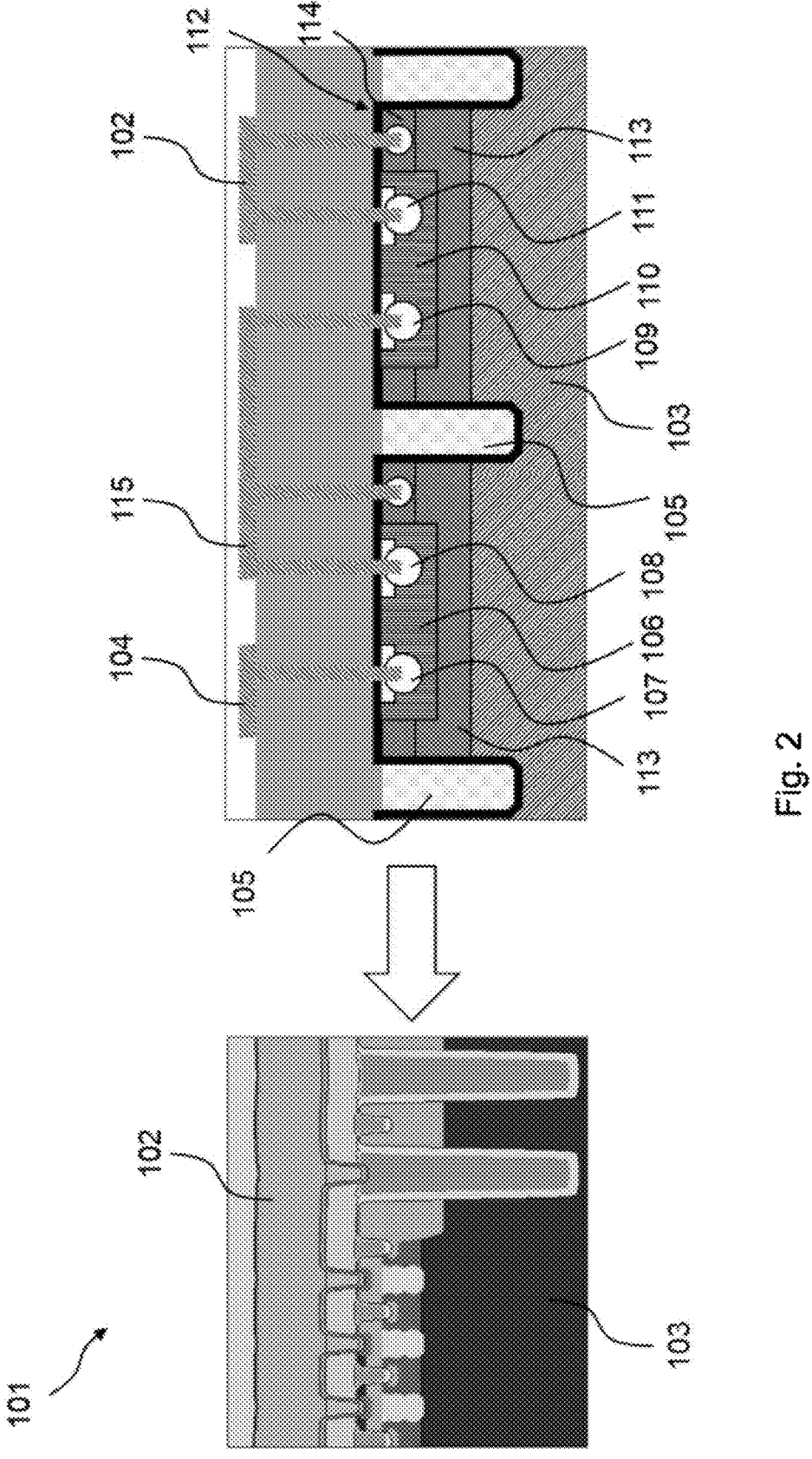
FIG. 2 discloses a schematic overview as well as a realistic implementation of a MOSFET in accordance with the present disclosure.

An example of the ESD protection semiconductor device 101 is shown in FIG. 2.

At the right hand side of FIG. 2 a schematic overview is provided of an ESD protection semiconductor device in accordance with the present disclosure and at the left hand side an actual manufactured example is provided.

The ESD protection semiconductor device 101 shown in FIG. 2 comprises a semiconductor body having a first major surface 112, and three trenches 105 extending from the first major surface 112 into the semiconductor body. The trenches 105 are isolating trenches, i.e. the comprise an isolating material like oxide or the like.

A substrate 103 is provided that may form the drain region of the MOSFET, in case a particular MOSFET is to be protected for ESD. It is noted that the substrate may be split into a drain region and a drift region but is not further elucidated in more detail with respect to FIG. 2.

A further region 113 is provided, wherein the further region 113 is abut the trenches 105.

The ESD protection semiconductor device 101 is construed such that it may be connected between the gate and the source terminal of a MOSFET, for example. The connection to the gate may be realized using the terminal indicated with reference numeral 104. The connection to the source may be realized using the terminal indicated with reference numeral 102.

A first ESD region of a first conductivity type is provided as indicated with reference numeral 106 and extends from the first major surface 112 into said semiconductor body, wherein the first ESD region 106 comprises:

a first diode region 107 of the second conductivity type, wherein the first diode region 107 is connected to the first ESD terminal 104;

a second diode region 108 of the second conductivity type, spaced apart from said first diode region 107, wherein the second diode region 108 is connected to a floating terminal 115;

a second ESD region 110 of a first conductivity type and extending from the first major surface 112 into said semiconductor body, wherein the second ESD region 110 comprises:

a third diode region 109 of the second conductivity type, wherein the third diode region 109 is connected to the floating terminal;

a fourth diode region 111 of the second conductivity type, spaced apart from said third diode region 109, wherein the fourth diode region 111 is connected to the second ESD terminal 102, wherein, in a top view of said ESD protection semiconductor device, said ESD protection semiconductor device is elongated, and wherein the floating terminal 115 comprises individual, electrically isolated, floating strips for providing connections between said second diode region and said third diode region.

It is noted that the connection as indicated with reference numeral 114 may be implemented for providing more robustness to the ESD protection semiconductor device 101.

Figure 3:
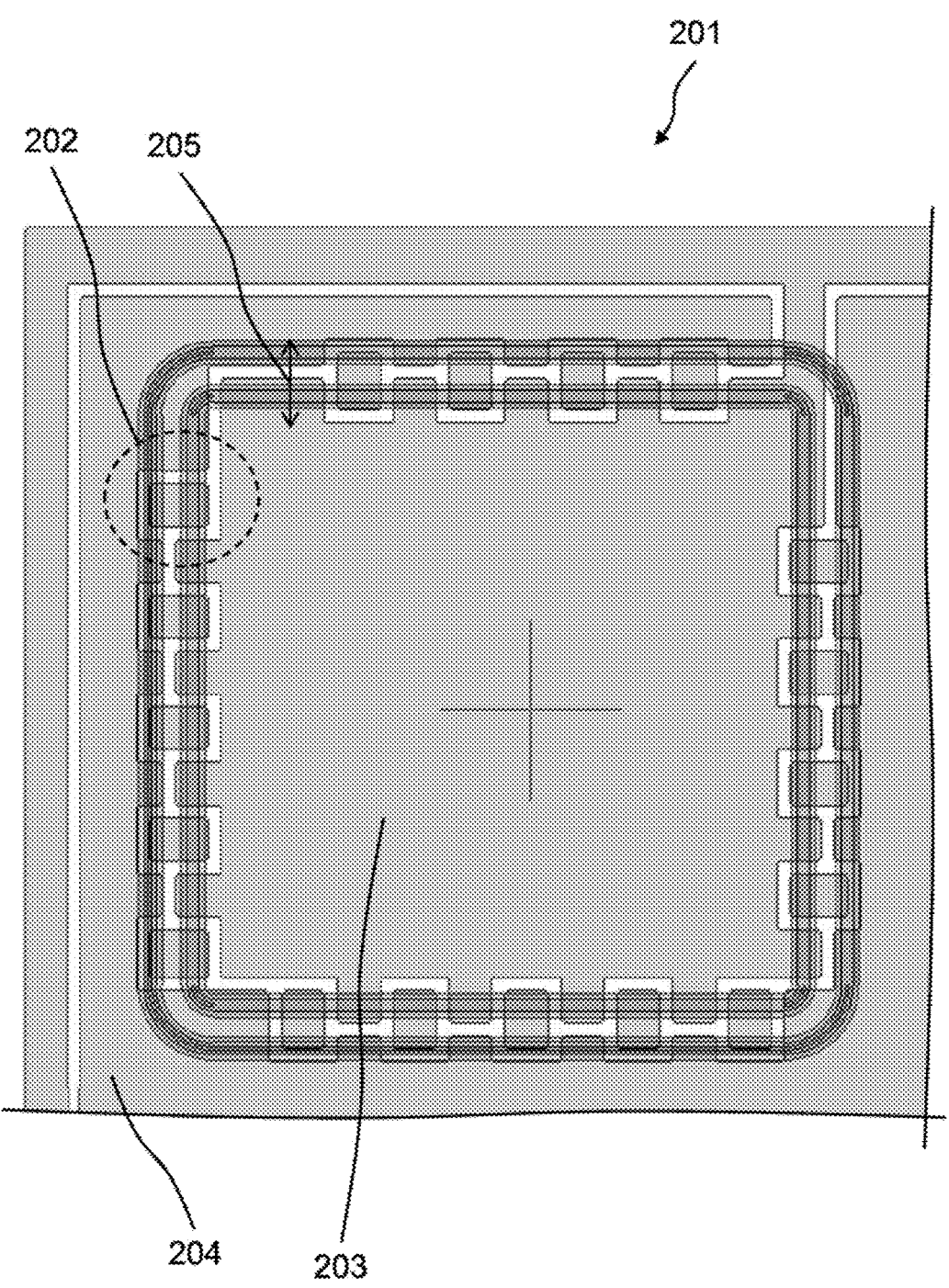
FIG. 3 discloses a top view of an ESD protection semiconductor device in accordance with the present disclosure.
Figure 4:
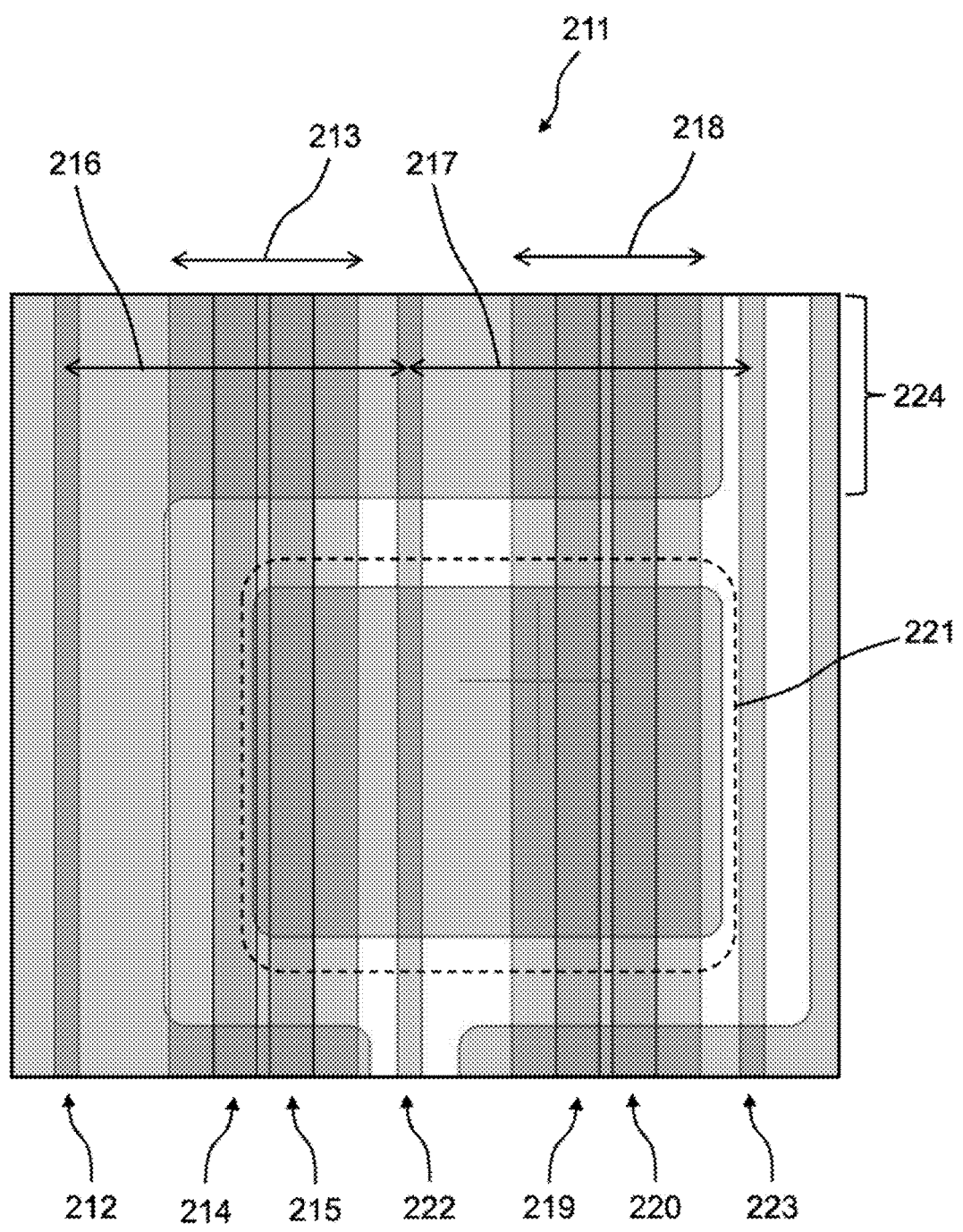
FIG. 4 discloses an exploded view of an ESD protection semiconductor device in accordance with the present disclosure.

The specific layout of the floating terminal 115 is discussed with respect to FIGS. 3 and 4.

FIG. 3 discloses a top view 201 of an ESD protection semiconductor device in accordance with the present disclosure and FIG. 4 discloses an exploded view 211 of an ESD protection semiconductor device in accordance with the present disclosure.

The exploded view is indicated with reference numeral 202. Both figures will be explained simultaneously here below for improving the understanding of the present disclosure.

The width of the ESD semiconductor device is indicated with reference numeral 205. As shown, the ESD semiconductor device is in the shape of an endless loop.

The ESD semiconductor device encompasses a semiconductor material that is indicated with reference numeral 203. This material may form, for example, the gate pad of a corresponding Metal Oxide Semiconductor, MOS, Field Effect Transistor, FET, MOSFET.

The area at the outside of the ESD semiconductor device is indicated with reference numeral 204. This material may be connected to, for example, the source pad of the MOSFET.

The ESD semiconductor device thus connects the gate pad at one side to the source pad at the other side of the device. The four diodes of the ESD semiconductor device are located between those two pads, along a circle.

The ESD protection semiconductor device comprises two ESD regions, wherein each ESD region is construed such that it consists of two back to back diodes. These two ESD regions are connected to one another via the floating terminal. More specifically, one end of a second diode of the first ESD region is connected to one end of a first diode in the second ESD region.

The floating terminal assures that such an electrical connection is actually made.

In accordance with the present disclosure, the floating terminal comprises multiple individual floating strips provided electrically isolated from each other and each for providing an individual connections between said second diode region and said third diode region.

As shown in FIG. 3, in total eighteen (18) individual floating strips are provided for providing the electrical connection throughout the elongated ESD regions. One of the benefits is that the width of the diodes may be made smaller, as will be apparent later here below.

The exploded view 202 is shown in FIG. 4. The first back-to-back diode is indicated with reference numeral 216. The second back-to-back diode is indicated with reference numeral 217.

The ESD protection semiconductor device comprises three isolating trenches as indicated with reference numerals 212, 222 and 223. These trenches comprise isolating material, like oxide or the like, for assuring a robust isolation between the ESD protection semiconductor device and the semiconductor device that it actually intends to protect.

The first ESD region is indicated with reference numeral 213, and the first diode region is indicated with reference numeral 214 and the second diode region is indicated with reference numeral 215. The second ESD region is indicated with reference numeral 218, the third diode region is indicated with reference numeral 219 and the fourth diode region is indicated with reference numeral 220.

The floating terminal is indicated with reference numeral 221. One of the aspects of the present disclosure, is that the connection to the first ESD terminal and the second ESD terminal, for example the connections towards the gate and source pad of a MOSFET, are made in between the different floating terminals. This is visually indicated with reference numeral 224.

To reduce the number of claims, certain aspects of the technology are presented below in certain claim forms, but the applicant contemplates the various aspects of the technology in any number of claim forms. For example, while some aspect of the technology may be recited as a computer-readable medium claim, other aspects may likewise be embodied as a computer-readable medium claim, or in other forms, such as being embodied in a means-plus-function claim.

In the description above, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope thereof.

What is claimed is:

1. An Electrostatic Discharge (ESD) protection semiconductor device for providing ESD protection between a first and a second terminal of another semiconductor device, the ESD protection device comprising a semiconductor body having a first major surface, wherein the semiconductor device further comprises a first ESD terminal arranged to be connected to the first terminal of the other semiconductor device, a second ESD terminal arranged to be connected to the second terminal of the other semiconductor device and a floating terminal, and wherein the semiconductor body further comprises:

a first ESD region of a first conductivity type that extends from the first major surface into the semiconductor body, wherein the first ESD region comprises:

a first diode region of a second conductivity type, wherein the first diode region is connected to the first ESD terminal;

a second diode region of the second conductivity type, spaced apart from the first diode region, wherein the second diode region is connected to the floating terminal;

a second ESD region of a first conductivity type and extending from the first major surface into the semiconductor body, wherein the second ESD region comprises:

a third diode region of the second conductivity type, wherein the third diode region is connected to the floating terminal;

a fourth diode region of the second conductivity type, spaced apart from the third diode region, wherein the fourth diode region is connected to the second ESD terminal;

wherein, when seen in a view of the ESD protection semiconductor device perpendicular to the first major surface, the first and second ESD regions are both elongated; and wherein the floating terminal comprises multiple individual floating strips provided electrically isolated from each other with each floating strip providing individual connections between the second diode region and the third diode region.

2. The ESD protection device according to claim 1, further comprising a first, a second and a third isolating trench, wherein each of the first, second and third trenches extend into the semiconductor body from the major surface, wherein the first ESD region is oriented between the first and second isolating trench, and wherein the second ESD region is oriented between the second and third isolating trench.

3. The ESD protection device according to claim 1, wherein, when viewed from a top view of the ESD protection semiconductor device, a shape of the ESD semiconductor device is a geometric shape thereby enclosing a semiconductor material of the semiconductor body.

4. The ESD protection device in accordance with claim 3, wherein the enclosed semiconductor material is to be connected to the first terminal of the other semiconductor device.

5. The ESD protection device according to claim 3, wherein the first and second ESD regions are each endless loops, seen in the top view, thereby enclosing the semiconductor material of the semiconductor body.

6. The ESD protection device in accordance according to claim 1, wherein, when seen in a view of the ESD protection semiconductor device that is perpendicular to the first major surface:
the first diode region is connected to the first ESD terminal at locations in between the multiple individual floating strips; and/or
the fourth diode region is connected to the second ESD terminal at the locations in between the multiple individual floating strips.

7. A Metal Oxide Semiconductor (MOS) Field Effect Transistor (FET) MOSFET having a gate pad and a source pad embodied in a semiconductor material, wherein the MOSFET further comprises an Electrostatic Discharge (ESD) protection semiconductor device according to claim 1.

8. The MOSFET in accordance with claim 7, wherein the ESD protection device is aligned with the gate pad of the MOSFET so that the first ESD terminal is connected to the gate pad.

9. A method of manufacturing an Electrostatic Discharge (ESD) protection device according to claim 1, wherein the method comprises the steps of:
forming the first ESD region of the first conductivity type that extends from the first major surface into the semiconductor body;
forming the first diode region of the second conductivity type in the first ESD region;
forming the second diode region of the second conductivity type in the first ESD region, spaced apart from the first diode region;
forming the second ESD region of the first conductivity type that extends from the first major surface into the semiconductor body:
forming the third diode region of the second conductivity type in the second ESD region;
forming the fourth diode region of the second conductivity type in the second ESD region, spaced apart from the third diode region,
wherein, when viewed from the top view of the ESD protection semiconductor device, the first and second ESD regions are both elongated; and
forming the floating terminal comprising forming multiple individual floating strips provided electrically isolated from each other with each floating strip providing individual connections between the second diode region and the third diode region.

10. The method according to claim 9, further comprising the step of:

forming a first, a second and a third isolating trench, wherein each of the first, second and third trenches extends into the semiconductor body from the major surface, wherein the first ESD region is oriented between the first and second isolating trench, and wherein the second ESD region is oriented between the second and third isolating trench.

11. The method according to claim 9, wherein, the ESD protection semiconductor device is formed so that in the top view of the ESD protection semiconductor device, a shape of the ESD protection semiconductor device is a geometric shape thereby enclosing a semiconductor material of the semiconductor body.

12. The method according to claim 11, wherein the ESD protection semiconductor device is formed so that, wherein, when seen in the view of the ESD protection semiconductor device that is perpendicular to the first major surface:
the first diode region is connected to the first ESD terminal at locations in between the multiple individual floating strips; and/or
the fourth diode region is connected to the second ESD terminal at the locations in between the multiple individual floating strips.

13. The method according to claim 9, wherein the first and second ESD regions are each endless loops, when seen in the top view, thereby enclosing the semiconductor material of the semiconductor body.

14. The method according to claim 13, wherein the ESD protection semiconductor device is formed so that, wherein, when seen in the view of the ESD protection semiconductor device that is perpendicular to the first major surface:
the first diode region is connected to the first ESD terminal at locations in between the multiple individual floating strips; and/or
the fourth diode region is connected to the second ESD terminal at the locations in between the multiple individual floating strips.

15. The method according to claim 9, wherein the ESD protection semiconductor device is formed so that, wherein, when seen in the view of the ESD protection semiconductor device that is perpendicular to the first major surface:
the first diode region is connected to the first ESD terminal at locations in between the multiple individual floating strips; and/or
the fourth diode region is connected to the second ESD terminal at the locations in between the multiple individual floating strips.

16. The method according to claim 10, wherein, the ESD protection semiconductor device is formed so that in the top view of the ESD protection semiconductor device, a shape of the ESD protection semiconductor device is a geometric shape thereby enclosing a semiconductor material of the semiconductor body.

17. The method according to claim 10, wherein the ESD protection semiconductor device is formed so that, wherein, when seen in the view of the ESD protection semiconductor device that is perpendicular to the first major surface:
the first diode region is connected to the first ESD terminal at locations in between the multiple individual floating strips; and/or
the fourth diode region is connected to the second ESD terminal at the locations in between the multiple individual floating strips.

* * * * *